July 24, 1962 W. A. FYFE ET AL 3,045,739

COMPONENT LEAD STRAIGHTENER

Filed July 6, 1960 2 Sheets-Sheet 1

INVENTORS
W. A. FYFE
A. W. SHORE

BY

ATTORNEY

July 24, 1962 W. A. FYFE ET AL 3,045,739

COMPONENT LEAD STRAIGHTENER

Filed July 6, 1960 2 Sheets-Sheet 2

INVENTORS
W.A. FYFE
A.W. SHORE
BY
ATTORNEY

United States Patent Office 3,045,739
Patented July 24, 1962

3,045,739

COMPONENT LEAD STRAIGHTENER

William A. Fyfe, North Reading, and Alfred W. Shore, Amesbury, Mass., assignors to Western Electric Company, Incorporated, New York, N.Y., a corporation of New York Filed July 6, 1960, Ser. No. 41,066
2 Claims. (Cl. 153—2)

This invention relates to apparatus for straightening the leads of electrical components, particularly leads which extend from opposing ends of components.

Electrical components of this type, such as resistors and capacitors, are in many instances mounted in spaced apertures of wiring boards and in order that the mounting operations may be performed efficiently, the leads of the components must be straight, in alignment, and of predetermined lengths. During processing of the components, frequently the leads become bent and it is the object of the present invention to straighten the leads and to cut excess lengths therefrom.

In accordance with the object, the invention comprises an apparatus for straightening component leads which extend from opposing ends of components, including like units spaced to receive the components therebetween, each unit having groups of elements with aligned recesses therein formed with curved innermost surfaces of the recesses substantially equal in radii to the radii of the leads so that when forcing means is applied to the leads to move them into their recesses, the leads are straightened.

More specifically, the elements of the two units are mounted for rotation on a spindle and are separated by spacers having surfaces disposed adjacent the innermost curved surfaces of the recesses to cooperate therewith and with surfaces of fixed members extending between the elements to straighten the leads. The leads become straightened when they are confined in a position in engagement with all three surfaces, in each instance, throughout each group of elements, spacers, and members. A cutter is provided for each group or unit with a cutting edge traversing the path of each lead, while confined, to cut excess lengths from the leads.

Figure 1:
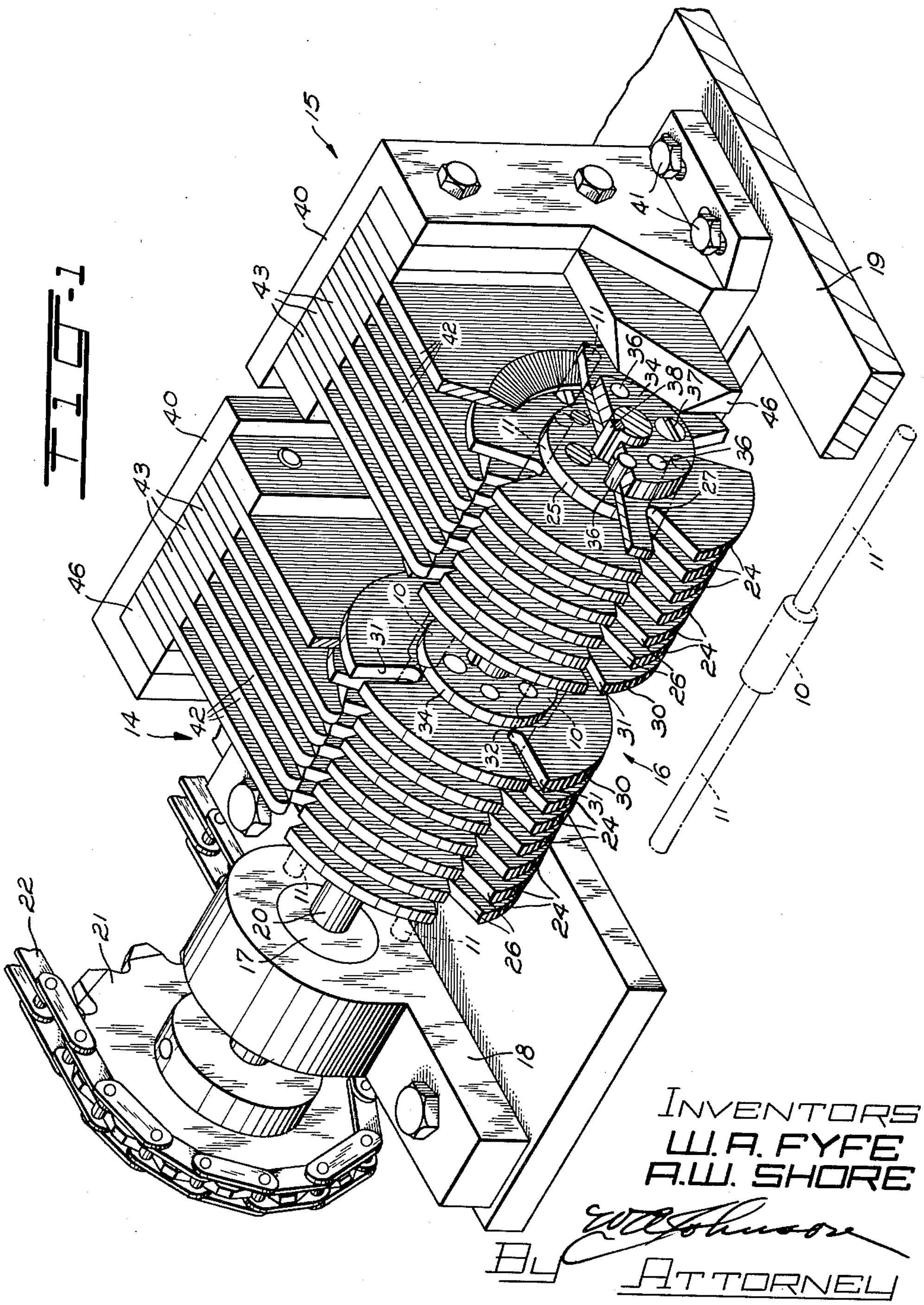
Figure 2:
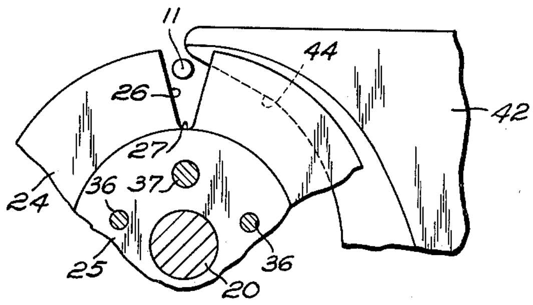
Figure 3:
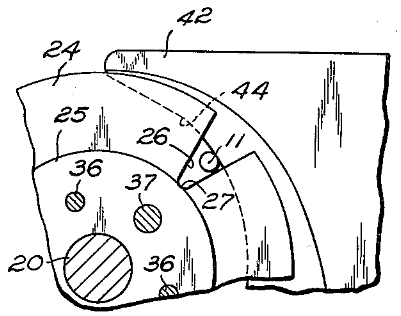
Figure 4:
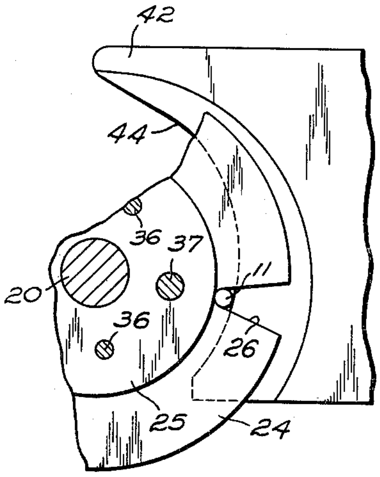

Other objects and advantages will be apparent from the following detailed description when considered in conjunction with the accompanying drawings wherein:

FIG. 1 is an isometric view of the apparatus; and

FIGS. 2, 3, 4, and 5 are fragmentary detailed views illustrating the actions of the recessed elements, the spacers, the members, and the cutters on the leads.

In the present illustration, one type of component 10 with leads 11 is illustrated in FIG. 1 after passing through the apparatus. Actually, the leads 11 are much smaller in diameter than that illustrated, but the leads and the recesses in the elements have been enlarged somewhat to more clearly illustrate the invention. The apparatus comprises like units 14 and 15 spaced at 16 to permit the components 10 to move freely therebetween while their leads are being straightened. Suitable bearings 17 mounted in brackets 18, only one of each being shown, fixedly mounted on a base 19, rotatably support a shaft 20. One end of the shaft 20 has a sprocket 21 mounted thereon and provided with a chain 22 to connect the sprocket to a suitable drive means, not shown.

Each unit 14 and 15 has a group of elements 24 mounted on the shaft 20 and spaced a given distance from each other by spacers 25. The elements 24 have four groups of substantially V-shaped notches or recesses 26 with curved innermost surfaces 27 substantially equal in radii to the radii of the leads 11. The side surfaces of the recesses extend diagonally outwardly to openings 28 in the peripheries of the elements 24. In the present instance, there are four groups of notches or recesses in each element, they being aligned with each notch or recess in their respective group and with their respective group of recesses or notches in each unit 14 and 15. An additional element 30 for each unit 14 and 15 is disposed at the inner end of each group of elements and provided with notches or recesses 31 with parallel side surfaces terminating in curved innermost surfaces 32 disposed in alignment with the curved surfaces 27 of the elements 24. The purpose of the elements 30 and their notches is to support the components 10 during the inner movements of the leads, while being straightened, to hold the components against twisting and to provide straight paths for the portions of the leads adjacent the ends of the components.

All of the elements 24, 30, and the spacers 25, are secured together so that their recesses will be in proper alignment when mounted on the shaft. In the present instance, inner and outer end members 34 are added to the groups of elements in spacers and provided with apertures aligned with similar apertures in the elements and spacers to receive connecting pins 36 and mounting screws 37. These features, including the pins 36 and the screws 37, join the elements, spacers, and end members together while a key 38, extending longitudinally of the shaft 20 through the structures of each unit, assure rotation thereof with the shaft.

Brackets 40 mounted at 41 on the base 19 serve to support members 42 in proper positions through the aid of spacers 43 so that they will extend between the elements 24 and 30. The members 42 are of the contours shown substantially in FIGS. 2 to 5, inclusive, having surfaces 44 curving gradually toward the spacers 25 to force their respective portions of the leads 11 into the recesses 26 and 31 of the elements 24 and 30, respectively. This forcing action continues gradually without physical disturbance of the leads so that, as a result, there is a joint straightening action brought about by the surfaces 44 applying the force to move the leads inwardly, the side surfaces of the recesses of the elements controlling this movement and the combination of all three surfaces, in each instance, the surface 44 of each member, the curved surface 27 of each recess, and the peripheral surface of each spacer jointly cooperating in each of the many instances to straighten the lead.

Figure 5:
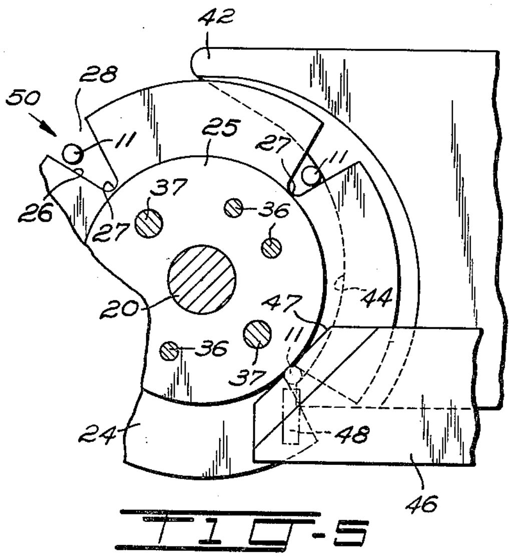

The complete straightening action occurs when each lead is confined between these surfaces and during this interval, as illustrated in FIG. 5, the component with its leads is moved relative to cutters 46, secured in their brackets 40, and having cutting edges 47 traversing the path of each lead. Reference number 48 identifies excess length of each lead removed therefrom by its cutter 46 and cutting edge 47.

*Operation*

The apparatus is operated continuously at a predetermined speed suitable for feeding the components to the apparatus at what might be termed a loading position. The loading position would be a position of the aligned recesses of the groups of elements prior to reaching their members 43, such as a position indicated at 50 in FIG. 5. The components may be fed manually or by suitable feeding means, not shown.

If the leads of a component fed to the apparatus at the loading position 50 should be straight, the component would move inwardly until the leads would rest on the surfaces of the spacers 25 and the curved surfaces 27 of the recesses 26 of the elements. However, this is seldom the case. In most instances, the leads are bent and, as a result, their inward movements are terminated short of the inner ends of the recesses and will be moved into engagement with the surfaces 44 of their members 42.

Regardless of the number and severity of the bends in the leads, all portions of the leads with exception of the excess lengths at the outer ends thereof, are acted upon through the combined functions of the surfaces 44 of the the *m* members 42, the side surfaces of the recesses 26, the inner curved surfaces 27 thereof, and the outer surfaces of the spacers 25, to bring all portions of each lead into a straight line and therefore move the excess portions outwardly to be cut at the proper positions by the cutting surfaces 47, while the leads are confined between these various surfaces. As the apparatus continues its operation, the components with their reduced lead lengths and straghtened leads, drop from the apparatus into suitable means for receiving them.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

1. An apparatus for straightening component leads which extend from opposing ends of components comprising like units spaced to receive each component therebetween at a loading station, a stationary base mounted at the loading station, spaced bearing brackets mounted on the base, a rotatable spindle supported thereby, a group of elements for each unit mounted on the spindle and having aligned groups of like substantially V-shaped notches therein providing guide surfaces extending diagonally outwardly from aligned arcuate inner straightening surfaces, like annular spacers mounted on the spindle adjacent the elements to space the elements like distances apart and having peripheral straightening surfaces disposed adjacent the arcuate straightening surfaces, stationary brackets for the units mounted on the base, and groups of stationary members mounted on the brackets at spaced parallel positions so that like portions thereof will extend parallel with and adjacent to the elements of their units, the stationary members having like straightening surfaces extending from positions adjacent the peripheries of the elements to positions adjacent the peripheral surfaces of the spacers to force the leads toward the arcuate straightening surfaces along any of the guide surfaces during rotation of the spindle and the elements until the leads for portions of their lengths are confined in the arcuate straightening surfaces of the elements and between the straightening surfaces of the stationary members and the peripheries of the spacers to straighten the leads.

2. An apparatus for straightening component leads according to claim 1 in which a cutter for each unit is mounted on the bracket for its stationary members and has a cutting edge traversing paths of each straightened lead while engaging the various straightening surfaces and being held firmly thereby to cause the cutters to cut excess lengths from the leads simultaneously.

References Cited in the file of this patent

UNITED STATES PATENTS

| | | |
|---|---|---|
| 1,666,844 | Centeno | Apr. 17, 1928 |
| 2,867,262 | Ainsworth et al. | Jan. 6, 1959 |
| 2,869,129 | Rogers | Jan. 20, 1959 |
| 2,928,452 | Diggle et al. | Mar. 15, 1960 |